United States Patent [19]

Hallenbeck

[11] Patent Number: 4,803,659
[45] Date of Patent: Feb. 7, 1989

[54] EPROM LATCH CIRCUIT

[75] Inventor: Kirby S. Hallenbeck, Shingle Springs, Calif.

[73] Assignee: Intel Corporation, Santa Clara, Calif.

[21] Appl. No.: 5,925

[22] Filed: Jan. 22, 1987

[51] Int. Cl.4 ............ G11C 7/00; G11C 17/00; G11C 11/34; G11C 11/40

[52] U.S. Cl. .................. 365/94; 365/189; 365/185; 365/104; 307/554

[58] Field of Search ............ 365/94, 185, 205, 104; 307/272 R, 273.3, 451, 554, 557, 445

[56] References Cited

U.S. PATENT DOCUMENTS

| 4,275,316 | 6/1981 | Knapp | 307/451 X |
| 4,651,303 | 3/1987 | Dias et al. | 365/185 |
| 4,686,652 | 8/1987 | Spence | 365/185 X |

FOREIGN PATENT DOCUMENTS 57-78688  5/1982  Japan ................. 365/185

Primary Examiner—Stuart N. Hecker
Assistant Examiner—Alyssa H. Bowler
Attorney, Agent, or Firm—Blakely, Sokoloff, Taylor & Zafman

[57] ABSTRACT

A latch circuit provides for a reading of a state of an EPROM cell and retains that state after the reading sequence is completed. The memory state of the EPROM is inputted to a NOR gate during a power on reset condition. The output of the NOR gate is fed back through an inverter to the input of the NOR gate, such that when the EPROM is deactivated, the input of the NOR gate is latched to the previous EPROM memory state.

10 Claims, 2 Drawing Sheets

EPROM LATCH CIRCUIT

BACKGROUND OF THE INVENTION

1. Field of the Invention

This invention relates to an improved cricuit for latching a state of memory during a power up and reset conditions.

2. Prior Art

The manufacture and use of electrically programmable read only memories (EPROMs) are a well-known technology in the prior art. EPROMs are used in various devices as well as in array structures to provide programmable memories and programmable logic devices.

EPROMs have the capability of storing a change within its cell and to retain the charge for prolonged period of time. When an EPROM has been programmed by having a charge stored in its cell, it is said to have been programmed. When there are no stored charges, the EPROM or is in an unprogrammed or erased state. Because an EPROM is capable of retaining a charge even when power is removed from the circuit, it is capable of retaining a memory state even when the circuit or the device has been deenergized. However, when the device is again energized, the state of the EPROM must be determined before the device is operational.

During the initialization phase when power is applied to a given device, a reset sequence is initiated to determine the various state of the EPROMs of the device. In the prior art, capacitors and other circuits activated the initialization sequence to determine the state of the EPROMs. Typically, these prior art circuits read the state of the EPROMs and latch that state to its respective bit line for processing. However, in most instances the EPROMs were continually being read to provide the information onto the bit line. Typically these power on latching circuits require the reading circuitry to consume power even after the EPROM state had been latched onto a bit line.

It is appreciated that what is needed is an improved circuit to latch the state of a given EPROM yet turning off the EPROM reading circuitry such that power consumption is limited to a minimum value once the reading of the EPROM has been achieved.

SUMMARY OF THE INVENTION

The present invention describes an improved circuit to latch the state of an EPROM cell onto a bit line. A first input of a NOR gate is coupled to the EPROM cell through a biasing transistor. When the biasing transistor is enabled the state of the memory cell is coupled to the first input of the NOR gate. A second input of the NOR gate is coupled to a reset signal.

The reset signal is activated during a reset condition such as during a power up condition. When the reset signal goes low, the inverse of the memory state which is currently on the first input, will be present on the output of the NOR gate. An inverter couples the output state as feedback to the first input line. When the biasing transistor is deactivated to terminate the reading of the memory state, the NOR gate is latched to provide a steach state at the output. The latching permits the memory cell and the biasing transistor to be turned off, wherein less power is consumed by the circuit.

DETAILED DESCRIPTION OF THE PREFERRED EMBODIMENT

An EPROM latching circuit for latching a state of an EPROM cell during a power up and reset condition in which power consumption is limited after the latching is described. In the following description, numerous specific details are set forth such as specific transistors, EPROM cell, etc., in order to provide a thorough understanding of the present invention. It will be obvious, however, to one skilled in the art that the present invention may be practiced without these specific details. In other instances, well-known circuits have not been described in detail in order not to unnecessarily obscure the present invention. Further, although the preferred embodiment is described in conjunction with a particular EPROM cell, it is evident to those skilled in the art that the present invention can be practiced with other devices which use other EPROM cells as well as different EPROM structures.

Figure 1:
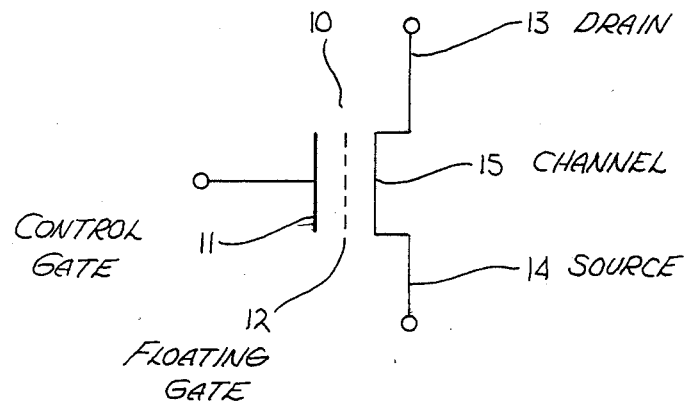
FIG. 1 is a schematic illustration of an EPROM cell.

Referring to FIG. 1, a MOS floating gate EPROM cell is shown. EPROM cell 10 is comprised of a device having a drain 13, source 14, control gate 11 and a floating gate 12. The manufacture of a typical floating gate EPROM cell 10 is well-known in the prior art. The operation of EPROM cell 10 is also well-known in the prior art. Floating gate 12 is in an uncharged state when cell 10 is unprogrammed. To program cell 10, a voltage higher in reference to the drain-source potential on drain 13 and source 14, is placed on control gate 11, wherein the charging voltage potential is placed between control gate 11 and drain 13. Electrons are attracted from channel 15 to floating gate 12. These electrons on floating gate 12 are trapped and remain trapped on floating gate 12 even after the removal of the charging voltage from control gate 11. The trapped electrons on floating gate 12 provide a higher charging voltage potential which remains on floating gate 12 as long as cell 10 is in the program state. The charging voltage applied to control gate 11 and the potential which remains on floating gate 12 are typically much higher in magnitude then the typical discrete voltage encountered during normal operations.

In operation, digital control signals are applied to control gate 11 to activate or deactivate cell 10. Typically these voltages encountered on control gate 11 are 0 and 5 volts. In the unprogrammed state, when the floating gate 12 is uncharged, the 0 and 5 volt digital control signals on control gate 11 determine the conduction or non-conductive of channel 15 of device 10. However, in the programmed state, when the floating gate 12 is charged, the non-conduction of channel 15 is not controlled by the signal on control gate 11. When floating gate 12 is charged in the programmed state, channel 15 will not conduct any current in cell 10. When floating gate 12 is uncharged (erased), then cell 10 will respond according to the control signal input to the control gate 11.

Figure 2:
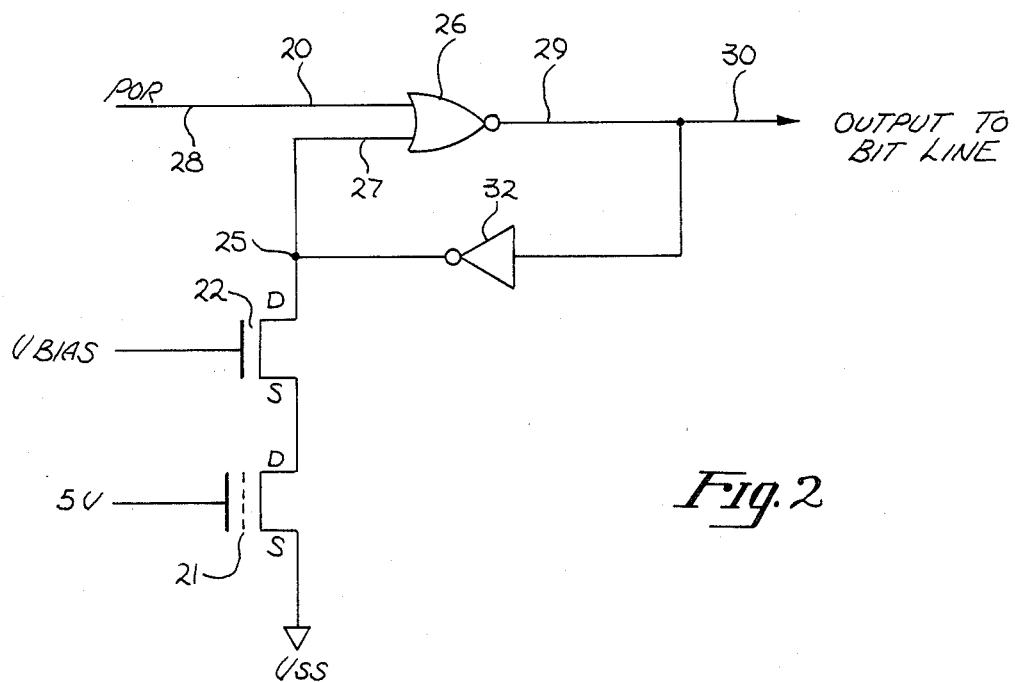
FIG. 2 is a schematic diagram showing a latching circuit of the present invention.

Referring to FIG. 2, the latching circuit 20 of the present invention is shown. An EPROM cell 21 which functions equivalently to the EPROM cell 10 described in FIG. 1 has its source coupled to Vss and its drain coupled to the source of biasing transistor 22. The drain of biasing transistor 22 is coupled to node 25. A NOR gate 26 has its first input line 27 coupled to node 25 and its second input line 28 coupled to an incoming POR (power on reset) signal. The output line 29 of NOR gate 26 is coupled to provide an output to a bit line 30. The output line 29 is also coupled to an input of an inverter 32. Inverter 32 has its output coupled to node 25. The gate of biasing transistor 22 is coupled to a biasing signal which is referred to as V bias in FIG. 2.

In operation, the state of the EPROM cell 21 is read when V bias activates transistor 22. A high V bias signal on the gate of transistor 22 will turn on transistor 22 activating the reading of EPROM cell 21. During the power up or reset condition, 5 volts is placed on the gate of EPROM cell 21. If the EPROM cell 21 is charged in a programmed state the presence of 5 volts on its gate will have no effect. However, if EPROM cell 21 is in an erased state, then the 5 volts on its gate will cause EPROM cell 21 to conduct. Therefore, when V bias activates biasing transistor 22 and 5 volts is placed on the control gate of EPROM cell 21, both biasing transistor 22 and EPROM cell 21 will conduct lowering the potential of node 25 to near Vss if EPROM cell 21 is unprogrammed.

Figure 3:
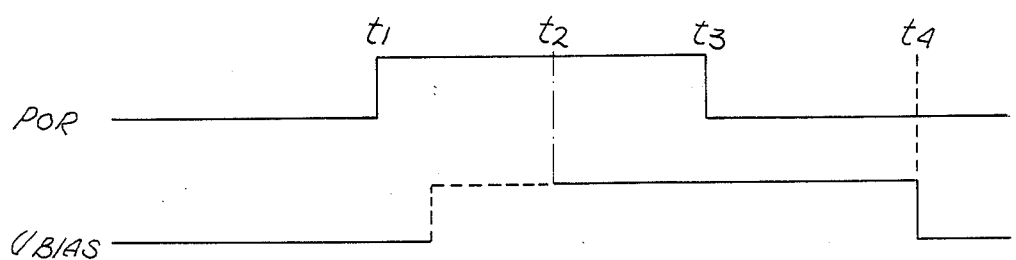
FIG. 3 is a timing diagram showing the reset and the biasing signals of FIG. 2.

Also referring to the timing diagram of FIG. 3, the operation of the circuit 20 is better described in conjunction with the timing diagrams showing signals POR and V bias. During the initialization phase, signal POR is activated causing input line 28 to go high at time t1. Either prior to time t1 or subsequently thereto, V bias is forced high that at such time t2 both POR and V bias are high. Then at time t3 POR transitions to a low state. An appreciable amount of time must exist between time t2 and time t3 such that an finite amount of time is given to read the state of EPROM cell 21. At time t3 when POR on line 28 goes low the state of line 27 is determined by the state of node 25. If cell 21 had been programmed, then cell 21 would not have conducted and node 25 would have stayed in a high state.

A high state condition of node 25 at time t3 translates to a low signal on the output of NOR gate 26 and a low output onto bit line 30. The low state output on line 29 which is coupled to inverter 32 provides a high signal on the output of inverter 32 which is coupled to node 25. At time t4 when V bias goes low to deactivate biasing transistor 22, node 25 and input line 27 of NOR gate 26 are latched to output line 29 through the feedback of inverter 32. A finite amount of time must transition between time t3 and t4 which permits the state on line 29 to transition through inverter 32 to latch node 25. At time t4 transistor 22 is deactivated which deactivates the reading sequence of EPROM 21. At this point of time t4, bit line 30 contains the inverted state of EPROM 21 for further processing. Further, the feedback through inverter 32 latches node 25 such that NOR gate 26 and inverter 32 provide a steady state latching circuit. Therefore, at this point EPROM 21 and the biasing transistor 22 may be turned off, wherein less power is consumed by these two devices.

Alternatively if EPROM 21 was in an erased state when time t3 occured, node 25 would be pulled down to low state causing line 27 to be at a low state also. At time t3 when signal POR goes low NOR gate 26 has both its input lines 27 and 28 at a low state wherein its output will be high. The high state on output line 29 is fed back through inverter 32 to provide a low state on node 25. Therefore, if the state of EPROM 21 is unprogrammed, then node 25 will latch to a low condition due to the inversion of the high signal on line 29. At time t4 when EPROM 21 and biasing transistor 22 are turned off, node 25 is again latched to the inversion of the signal on line 29. In summary, node 25 will latch to the state of the EPROM 21 initially and will maintain that state even after the EPROM is turned off because of the feedback by inverter 32.

Figure 4:
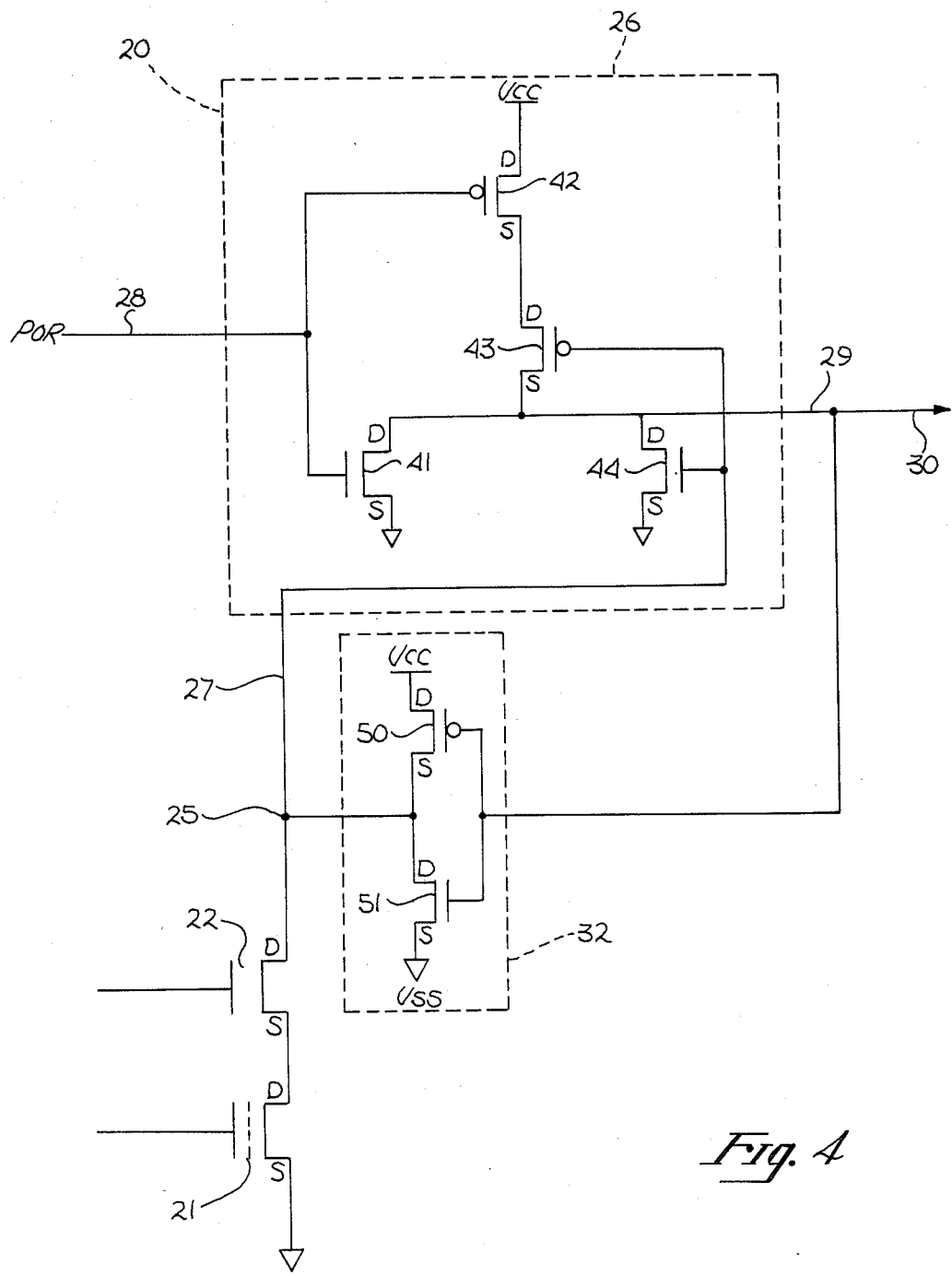
FIG. 4 is a schematic diagram of FIG. 2 showing a CMOS implementation of the NOR gate and the inverter.

Referring to FIG. 4, the circuitry of FIG. 3 is shown but with NOR gate 26 and inverter 32 expanded. NOR gate 26 and inverter 32 of the preferred embodiment are CMOS devices. NOR gate 26 is comprised of four transistors 41–44. The input line 28 which contains the POR signal is coupled to the gates of transistors 41 and 42. Input line 27 is coupled to the gates of transistors 43 and 44. The drain of transistor 42 is coupled to Vcc and the source of transistor 42 is coupled to the drain of transistor 43. Source of transistor 43, drains of transistors 41 and 44 are coupled together to output line 29. Sources of transistors 41 and 44 are coupled to Vss, which in this case is ground. Transistors 41 and 44 are activated when its respective gates go high, whereas transistors 42 and 443 are activated when its respective gates go low. If input line 27 is low, transistor 44 is activated and a low potential is placed on line 29. A low condition exists on line 29 when POR is high activating transistor 41. When both line 27 and 28 are low, transistors 42 and 43 are activated, putting a high state on line 29.

The inverter 32 is comprised of transistors 50 and 51. The drain of transistor 50 is coupled to Vcc and the source of transistor 50, as well as drain of transistor 51, are coupled to node 25. The source of transistor 51 is coupled to Vss. The input line to inverter 32 is coupled to the gates of transistors 50 and 51. Transistor 50 is activated when its gate goes low and transistor 51 is activated when its gate goes high. Therefore, when line 29 is low, transistor 50 is activated and a high state is put on node 25. When line 29 is high, transistor 51 conducts and a low state is placed on node 25.

Although a particular configuration is shown in FIG. 4, it is appreciated that other circuits may be implemented to achieve the same function. Further, although a NOR gate and an inverter are used in the latching circuit 20 of the preferred embodiment other gates may be implemented to achieve the same logical truth table achieved with the present invention. It is also evident that even though only one EPROM cell 21 is shown, a plurality of EPROM cells can be coupled either in parallel or in series with node 25, as is the case when EPROM array structure devices are utilized, without departing from the spirit and scope of the invention.

Thus an EPROM latching circuit is described.

I claim

1. A circuit for latching a state of a memory, comprising:
   a first gating means coupled to said memory for reading said state of said memory;
   said first gating means also coupled to receive an enabling signal which activates said reading of said memory;
   said first gating means further coupled to the output of a feedback means and to the input of a second gating means;

said second gating means having a first input, said first input being coupled to said first gating means for receiving said state of said memory when said first gating means is activated;

said second gating means having a second input, said second input coupled to a reset signal;

said second gating means having an output, said output being determined by said state of said memory once said reset signal is deactivated;

said feedback means coupled to said output and said first input of said second gating means to latch said first input to said memory state, such that when said first gating means is deactivated, said input is latched to coincide with said memory state.

2. The circuit of claim 1, wherein said memory is comprised of an electrically programmable read-only-memory.

3. The circuit of claim 2, wherein said second gating means is comprised of a NOR gate.

4. The circuit of claim 3, wherein said feedback means is an inverter.

5. The circuit of claim 4, wherein said first gating means is comprised of a field-effect transistor.

6. A circuit for latching a bit state of an electrically programmable read only memory (EPROM) cell onto a bit line, comprising:

first gating means coupled to said EPROM memory cell for reading said state of said memory cell;

said first gating means also coupled to receive an enabling signal which activates said reading of said EPROM memory cell;

second gating means having a first input, a second input and an output;

said first input being coupled to said first gating means for receiving said state of said EPROM memory cell when said first gating means is activated;

said second input coupled to receive a power on reset signal;

said output coupled to said bit line, said output being determined by said state of said memory on said first input when said power on reset signal is deactivated;

a feedback loop coupled to said first input and output for latching said first input to said memory state of said EPROM memory cell, such that when said first gating means is deactivated after said power on reset signal is deactivated, said first input is latched to said output to coincide with said state of said EPROM memory cell and said memory is deactivated to conserve power.

7. The circuit of claim 6, wherein said second gating means is comprised of a CMOS NOR gate.

8. The circuit of claim 7, wherein said feedback loop includes an inverter.

9. The circuit of claim 8, wherein said first gating means is comprised of a field-effect transitor.

10. The circuit of claim 9, wherein a plurality of EPROM cells are coupled to said circuit.

* * * * *